(12) United States Patent
Takaishi (10) Patent No.: US 7,642,139 B2
(45) Date of Patent: Jan. 5, 2010

(54) SEMICONDUCTOR DEVICE PRODUCTION METHOD AND SEMICONDUCTOR DEVICE

(75) Inventor: Masaru Takaishi, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 409 days.

(21) Appl. No.: 10/577,360

(22) PCT Filed: Dec. 24, 2004

(86) PCT No.: PCT/JP2004/019732

§ 371 (c)(1),
(2), (4) Date: Apr. 28, 2006

(87) PCT Pub. No.: WO2005/064684

PCT Pub. Date: Jul. 14, 2005

(65) Prior Publication Data

US 2007/0069324 A1    Mar. 29, 2007

(30) Foreign Application Priority Data

Dec. 26, 2003    (JP) ............................... 2003-435266

(51) Int. Cl.
    H01L 21/332    (2006.01)
    H01L 21/336    (2006.01)
    H01L 21/76     (2006.01)
    H01L 29/78     (2006.01)

(52) U.S. Cl. .................. 438/140; 257/487; 257/492; 257/493; 257/494; 257/E29.256; 257/E21.418; 438/138; 438/268; 438/425; 438/430

(58) Field of Classification Search .................. None
See application file for complete search history.

(56) References Cited

U.S. PATENT DOCUMENTS

| 5,391,506 A | 2/1995 | Tada et al. |
| 6,307,246 B1 | 10/2001 | Nitta et al. |
| 6,413,822 B2 | 7/2002 | Williams et al. |

(Continued)

FOREIGN PATENT DOCUMENTS

EP    1 168 455 A2    1/2002

(Continued)

OTHER PUBLICATIONS

Saggio M et al: "MDMESH™ : Innovative Technology for High Voltage PowerMOSFETs" Proceedings of the International Symposium on Powersemiconductor Devices and ICS, New York, NY, US, May 22, 2000, pp. 65-68, XP000985371.

*Primary Examiner*—Andy Huynh
*Assistant Examiner*—Hoang-Quan T Ho
(74) *Attorney, Agent, or Firm*—Rabin & Berdo, PC (57) ABSTRACT

A production method for a semiconductor device, including the steps of: forming a semiconductor layer of the first conductivity on the semiconductor substrate; forming a trench in the semiconductor layer, the trench penetrating through the semiconductor layer to reach the semiconductor substrate; filling a filling material in a predetermined bottom portion of the trench, so that a filling material portion is provided in the bottom portion of the trench up to a predetermined upper surface position which is shallower than an interface between the semiconductor substrate and the semiconductor layer; and, after the filling step, introducing an impurity of the second conductivity into a portion of the semiconductor layer exposed to an interior side wall of the trench.

6 Claims, 10 Drawing Sheets

U.S. PATENT DOCUMENTS

| | | | |
|---|---|---|---|
| 2002/0005549 A1* | 1/2002 | Saito et al. | 257/328 |
| 2002/0040994 A1* | 4/2002 | Nitta et al. | 257/328 |
| 2002/0175368 A1 | 11/2002 | Izumisawa et al. | |
| 2002/0185705 A1* | 12/2002 | Saitoh et al. | 257/492 |
| 2004/0150040 A1* | 8/2004 | Nitta et al. | 257/342 |
| 2005/0170587 A1 | 8/2005 | Izumisawa et al. | |

FOREIGN PATENT DOCUMENTS

| | | |
|---|---|---|
| JP | 60-244043 | 12/1985 |
| JP | 4-273462 | 9/1992 |
| JP | 5-218415 | 8/1993 |
| JP | 2000-277733 | 10/2000 |
| JP | 2003-46082 | 2/2003 |
| JP | 2003-92386 | 3/2003 |
| JP | 2003-101022 | 4/2003 |
| WO | WO 00/05767 | 2/2000 |

* cited by examiner

SEMICONDUCTOR DEVICE PRODUCTION METHOD AND SEMICONDUCTOR DEVICE

TECHNICAL FIELD

The present invention relates to a semiconductor device having a so-called super junction structure and to a production method therefor.

BACKGROUND ART

An attempt has been made to increase the breakdown voltage of a semiconductor device including a MOS field effect transistor (metal oxide semiconductor field effect transistor, MOS FET).

Figure 6:
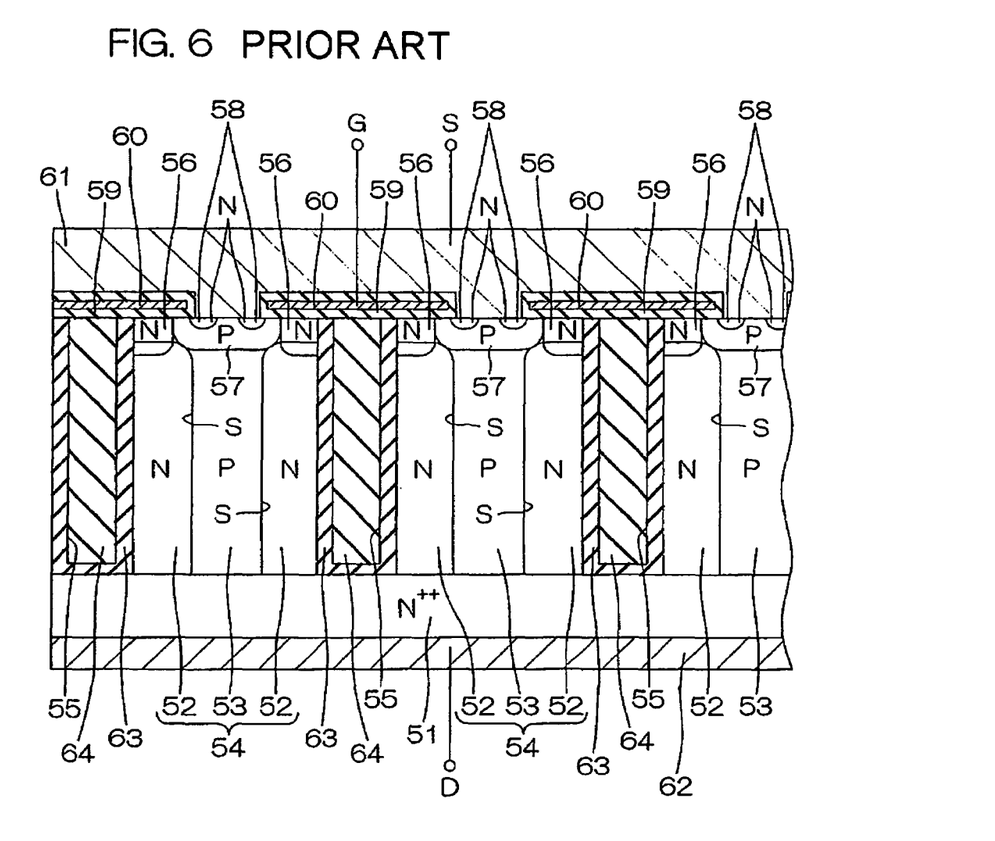
FIG. 6 is a schematic sectional view of a prior art semiconductor device including MOSFETs.

FIG. 6 is a schematic sectional view of a prior art semiconductor device including MOS FETs (see Japanese Unexamined Patent Publication No. 2003-46082).

A semiconductor layer 54 including N-type drift layers (N-type pillar layers) 52 and P-type RESURF (reduced surface field) layers (P-type pillar layers) 53 is provided on an $N^{++}$-type semiconductor substrate 51. The drift layers 52 and the RESURF layers 53 are recurrently arranged in alternate relation in a direction parallel to the semiconductor substrate 51 to provide a so-called super junction structure.

A plurality of trenches 55 are provided in the semiconductor layer 54 as extending thicknesswise of the semiconductor layer 54 and having a depth such as to reach an interface between the semiconductor substrate 51 and the semiconductor layer 54. The trenches 55 each have interior side walls generally perpendicular to the semiconductor substrate 51, and are generally equidistantly arranged parallel to each other. The interior walls of the trenches 55 are each covered with an oxide film 63, and the insides of the trenches 55 are each filled with a buried layer 64 such as of polysilicon or a dielectric material.

The drift layers 52 are each disposed alongside the trench 55. The RESURF layers 53 are each disposed between a pair of drift layers 52 disposed alongside each adjacent pair of trenches 55. The RESURF layer 53 contacts the pair of drift layers 52 and the semiconductor substrate 51.

N-type regions 56 are each provided on the drift layer 52. P-type base layers 57 are each provided on the RESURF layer 53 in contact with the adjacent N-type regions 56. N-type source regions 58 are provided in a surface portion of each of the base layers 57.

Gate electrodes 60 are each disposed in opposed relation to a region including portions of the base layers 57 between the N-type regions 56 and the source regions 58 with the intervention of an insulative film 59. A source electrode 61 is provided in contact with the source regions 58 and the base layers 57. A drain electrode 62 is provided on a back surface of the semiconductor substrate 51 (opposite from a surface of the semiconductor substrate formed with the gate electrodes 60 and the source electrode 61).

The semiconductor device is used in such a state that, with one of the source electrode 61 and the drain electrode 62 connected to an external load, a predetermined voltage from a power source is applied between the external load and the other of the source electrode 61 and the drain electrode 62. The applied voltage provides a reverse bias to PN junctions defined between the RESURF layers 53 and the drift layers 52.

In this state, the gate electrodes 60 are kept at a proper potential (the MOS FETs are turned on), whereby electric currents flow between the source electrode 61 and the drain electrode 62. At this time, channels are formed in the portions of the base layers 57 between the N-type regions 56 and the source regions 58 in the vicinity of interfaces between the insulative films 59 and the base layers 57. Thus, the electric currents flow from the drain electrode 62 to the source electrode 61 through the semiconductor substrate 51, the drift layers 52, the N-type regions 56, the portions of the base layers 57 adjacent to the interfaces between the insulative films 59 and the base layers 57 (the channels) and the source regions 58.

At this time, a reverse bias resulting from voltage division between the external load and the ON-resistances of the MOS FETs is applied to the PN junctions defined between the RESURF layers 53 and the drift layers 52. However, depletion layers occurring due to the reverse bias spread to a negligible extent, so that carrier (electron) paths are present in the respective drift layers 52.

Next, an explanation will be given to a state to be observed when the MOS FETs are off, i.e., when the gate electrodes 60 are not kept at the proper potential. In this case, the channels are not formed, so that no electric current flows in the MOS FETs. Therefore, the whole source voltage is applied as a reverse bias to the PN junctions defined between the drift layers 52 and the RESURF layers 53. Hence, the depletion layers immediately spread into the drift layers 52 and the RESURF layers 53 from interfaces S between the drift layers 52 and the RESURF layers 53, whereby the drift layers 52 and the RESURF layers 53 are completely depleted. This theoretically realizes a higher breakdown voltage.

However, the RESURF layers 53 also contact the semiconductor substrate 51 of the $N^{++}$-type conductivity. Therefore, when the reverse bias voltage is applied to the PN junctions defined between the drift layers 52 and the RESURF layers 53, depletion layers also spread into the RESURF layers 53 and the semiconductor substrate 51 from interfaces between the RESURF layers 53 and the semiconductor substrate 51.

At this time, the depletion layers spread in regions adjacent to the interfaces S between the drift layers 52 and the RESURF layers 53 and in regions adjacent to the interfaces between the semiconductor substrate 51 and the RESURF layers 53 in different manners, because the semiconductor substrate 51 and the drift layers 52 have different impurity concentrations. Therefore, when the semiconductor device is off, strong electric fields locally occur in the depletion layers, so that the electric currents flow in strong electric field regions. Therefore, the breakdown voltage of the semiconductor device is not satisfactory in practice.

DISCLOSURE OF THE INVENTION

It is an object of the present invention to provide a production method for a semiconductor device having an increased breakdown voltage.

It is another object of the present invention to provide a semiconductor device having an increased breakdown voltage.

A semiconductor device production method according to the present invention is a production method for a semiconductor device which includes a super junction structural portion provided on a semiconductor substrate of a first conductivity and including drift layers of the first conductivity and RESURF layers of a second conductivity different from the first conductivity, the drift layers and the RESURF layers being laterally arranged in alternate relation in a direction parallel to the semiconductor substrate. The production method comprises the steps of: forming a semiconductor layer of the first conductivity on the semiconductor substrate; forming a trench in the semiconductor layer, the trench penetrating through the semiconductor layer to reach the semiconductor substrate; filling a filling material in a predetermined bottom portion of the trench, so that a filling material portion is provided in the bottom portion of the trench up to a predetermined upper surface position which is shallower than an interface between the semiconductor substrate and the semiconductor layer and a void is provided in an upper portion of the trench above the predetermined upper surface position; and, after the filling step, introducing an impurity of the second conductivity into a portion of the semiconductor layer exposed to an interior side wall of the trench, whereby the RESURF layers of the second conductivity are each formed alongside the interior side wall of the trench and the drift layers are each defined by a portion of the semiconductor layer remaining intact.

According to the present invention, the RESURF layers are each provided alongside the interior side wall of the trench penetrating through the semiconductor layer to reach the semiconductor substrate, and the drift layers are each defined by the portion of the semiconductor layer remaining intact after the formation of the RESURF layer. Thus, the semiconductor device is produced as having a so-called super junction structure in which the drift layers and the RESURF layers are arranged recurrently (alternately) in a direction parallel to the semiconductor substrate. The RESURF layers may be provided alongside only one of widthwise opposite interior side walls of the trench or alongside the widthwise opposite interior side walls of the trench.

In the RESURF layer formation step, the filling material portion is present in the bottom portion of the trench, and the upper surface of the filling material portion is located at the position shallower than the interface between the semiconductor substrate and the semiconductor layer as measured from the surface of the semiconductor layer. Therefore, the filling material portion prevents the impurity of the second conductivity (an impurity for control of impartation with the second conductivity) from being introduced into a portion of the semiconductor layer adjacent to the semiconductor substrate. Thus, the RESURF layers are isolated from the semiconductor substrate by the drift layers (the portions of the semiconductor layer remaining intact).

In the semiconductor device produced by the inventive production method, depletion layers spread into the drift layers and the RESURF layers from interfaces between the drift layers and the RESURF layers (hereinafter referred to simply as "interfaces") when a reverse bias is applied to PN junctions defined between the drift layers and the RESURF layers. In this case, when an applied voltage is increased to not lower than a predetermined level, the drift layers and the RESURF layers are almost completely depleted. Therefore, the semiconductor device has a predetermined breakdown voltage (e.g., several hundreds volts).

Semiconductor portions having a generally even impurity concentration are present between the RESURF layer and the semiconductor substrate and between the RESURF layer and the trench or between two adjacent RESURF layers in each of the drift layers. Therefore, the depletion layers uniformly spread from the interfaces in the drift layers. That is, the depletion layers equally spread toward the trenches opposed to the interfaces with the intervention of the drift layers (parallel to the semiconductor substrate), and toward the semiconductor substrate opposed to the interfaces with the intervention of the drift layers (perpendicularly to the semiconductor substrate) in the drift layers from the interfaces.

Therefore, strong electric fields do not locally occur in the depletion layers, so that the electric currents do not easily flow through the interfaces. That is, the semiconductor device has an increased breakdown voltage (e.g., 200V to 1000V) as compared with the prior art semiconductor device.

The RESURF layer formation step may include the steps of implanting the impurity of the second conductivity into a surface portion of the semiconductor layer exposed to the interior side wall of the trench, and performing a thermal diffusion process to heat the resulting semiconductor substrate after the implantation step for diffusing the implanted impurity into the semiconductor layer.

The filling step may include the steps of supplying the filling material into the trench up to a position which is shallower than the predetermined upper surface position and, after the filling material supplying step, etching back the supplied filling material to the predetermined upper surface position.

By controlling an etching-back thickness, the upper surface of the filling material portion can be located at the position shallower than the interface between the semiconductor substrate and the semiconductor layer, so that the position of the upper surface of the filling material portion can be arbitrarily adjusted. Thus, the width of a portion of the drift layer present between the RESURF layer and the semiconductor substrate can be easily controlled.

The filling material supplying step may include the step of almost completely filling the trench with the filling material. That is, the filling material supplying step may include the step of supplying the filling material so that an upper surface of the filling material is located outside the trench.

The filling step may include the step of filling silicon oxide as the filling material in the trench.

In this case, the step of filling silicon oxide in the trench may include the steps of filling polysilicon in the trench, and oxidizing the polysilicon to provide silicon oxide as the filling material.

Alternatively, the step of filling silicon oxide in the trench may include the steps of filling TEOS (tetraethylorthosilicate) in the trench, and thermally decomposing TEOS to provide silicon oxide as the filling material.

The filling step may include the step of filling polysilicon as the filling material in the trench and, in this case, the semiconductor device production method may further comprise the step of forming an oxide film by oxidizing an interior wall of the trench before the filling step.

The oxide film electrically isolates the filling material (polysilicon) portion from the semiconductor substrate and the super junction structural portion. The oxide film formation step may include the step of thermally oxidizing the interior wall of the trench.

The semiconductor device production method may further comprise the step of filling the void in the upper portion of the trench with an upper filling material after the RESURF layer formation step.

Thus, the semiconductor device can be provided in which the trench is almost completely filled with the filling material and the upper filling material. This prevents the semiconductor substrate from being warped.

The filling material to be filled in the trench before the RESURF layer formation step and the upper filling material (the filling material to be filled in the trench after the RESURF layer formation step) may be of the same type or of different types.

The inventive semiconductor device production method may further comprise the steps of: introducing an impurity of the second conductivity into a surface portion of the semiconductor layer to form a base region of the second conductivity in contact with the RESURF layer and the drift layer; introducing an impurity of the first conductivity into a portion of the base region to form a source region of the first conductivity which is isolated from the drift layer and the RESURF layer by the other portion of the base region; forming a gate insulation film opposed to a portion of the base region between the source region and the drift layer; and forming a gate electrode opposed to the portion of the base region between the source region and the drift layer with the intervention of the gate insulation film.

In the semiconductor device produced by the production method, channels are formed in portions of base regions between source regions and the drift layers in the vicinity of gate insulation films by applying a voltage of a proper level between the source regions and the semiconductor substrate (drain region) and keeping gate electrodes at a predetermined potential (turning on the semiconductor device). Thus, electric currents flow between the source regions and the semiconductor substrate (drain region).

Even if a higher reverse bias voltage is applied to the PN junctions defined between the drift layers and the RESURF layers when the semiconductor device is off, the semiconductor device has a higher breakdown voltage.

A semiconductor device according to the present invention comprises a semiconductor substrate of a first conductivity, a super junction structural portion provided on the semiconductor substrate and including drift layers of the first conductivity and RESURF layers of a second conductivity different from the first conductivity, the drift layers and the RESURF layers being laterally arranged in alternate relation in a direction parallel to the semiconductor substrate, and filling material portions each provided in a predetermined bottom portion of a trench penetrating through the super junction structural portion to reach the semiconductor substrate. The RESURF layers are each provided alongside an interior side wall of the trench. The drift layers each have an isolation region present between the RESURF layer and the semiconductor substrate to prevent the RESURF layer from contacting the semiconductor substrate. The filling material portion in the trench has an upper surface located at substantially the same depth as an interface between the isolation region and the RESURF layer as measured from a surface of the super junction structural portion.

The filling material portion may be composed of an insulative material such as silicon oxide or an electrically conductive material (a semiconductor material) such as silicon (e.g., polysilicon) covered with an insulative material.

An upper portion of the trench above the filling material portion may be a void left unfilled, but is preferably filled with a filling material (upper filling material) separately from the formation of the filling material portion.

The inventive semiconductor device may further comprise base regions of the second conductivity each provided in contact with the drift layer and the RESURF layer, source regions of the first conductivity each provided in contact with the base region and isolated from the drift layer and the RESURF layer by the base region, and gate electrodes each provided in opposed relation to a portion of the base region between the source region and the drift layer with the intervention of a gate insulation film.

The foregoing and other objects, features and effects of the present invention will become more apparent from the following description of the embodiments with reference to the attached drawings.

EMBODIMENTS OF THE INVENTION

Embodiments of the present invention will hereinafter be described in detail with reference to the attached drawings.

Figure 1:
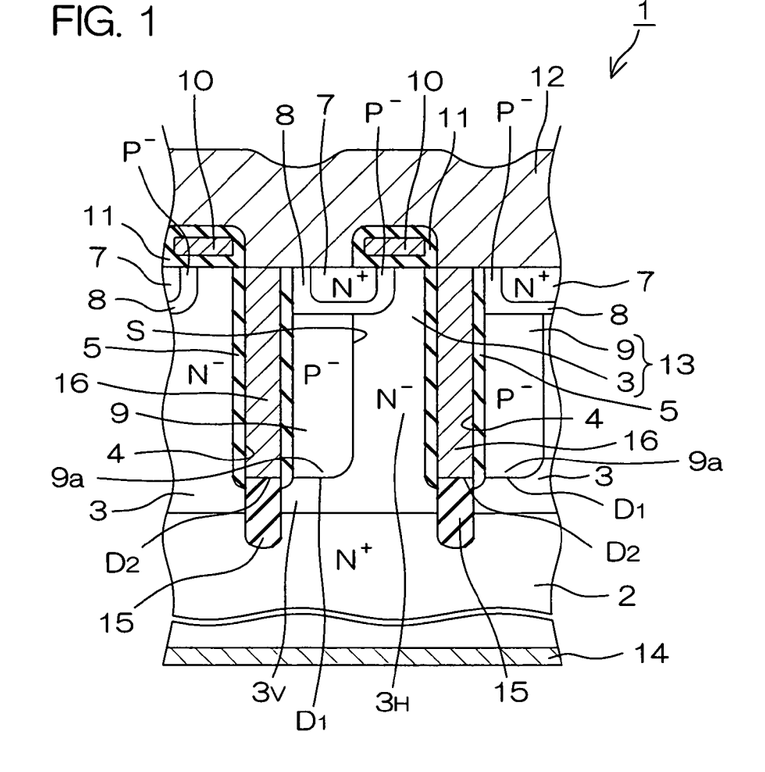
FIG. 1 is a schematic sectional view illustrating the construction of a semiconductor device according to a first embodiment of the present invention.

FIG. 1 is a schematic sectional view illustrating the construction of a semiconductor device according to a first embodiment of the present invention.

A super junction structural portion 13 having a so-called super junction structure is provided on a silicon substrate 2 of an $N^+$-type conductivity serving as a drain region. The super junction structural portion 13 includes drift layers 3 of an $N^-$-type conductivity and RESURF layers 9 of a $P^-$-type conductivity buried in the respective drift layers 3. The drift layers 3 and the RESURF layers 9 are alternately (recurrently) arranged in a direction parallel to the silicon substrate 2.

A plurality of trenches 4 are provided generally parallel to each other as penetrating through the super junction structural portion 13 and having a depth such as to reach the silicon substrate 2. The trenches 4 each have interior side walls generally perpendicular to the silicon substrate 2, and extend perpendicularly to a paper face of FIG. 1. That is, the trenches 4 each have a length perpendicular to the paper face of FIG. 1, and a width parallel to the paper face of FIG. 1 and parallel to the silicon substrate 2.

Although only two trenches 4 are shown in FIG. 1, the semiconductor device 1 has a greater number of trenches 4, which are equidistantly arranged.

Inside the respective trenches 4, silicon oxide portions 15 are provided in bottoms of the trenches 4, and polysilicon portions 16 are provided on the silicon oxide portions 15. Silicon oxide films 5 are respectively present between the trenches 4 and the polysilicon portions 16. The trenches 4 are each almost completely filled with the silicon oxide portion 15 and the polysilicon portion 16. Thus, the silicon substrate 2 is less liable to be warped.

The RESURF layers 9 are each disposed alongside an interior side wall of the trench 4 on one of widthwise opposite sides of the trench. That is, the RESURF layer 9 is disposed between two adjacent trenches 4 in the vicinity of one of these trenches 4 in contact with the silicon oxide film 5.

The drift layers 3 are each disposed parallel to the RESURF layer 9 between two adjacent RESURF layers 9 (between the RESURF layer 9 and the trench 4) alongside an interior side wall of the trench 4 on the other widthwise side of the trench. Further, the drift layer 3 is partly present below the RESURF layer 9 (between the silicon substrate 2 and the RESURF layer 9). That is, the RESURF layer 9 is isolated from the silicon substrate 2 by the drift layer 3, SO that the RESURF layer 9 does not contact the silicon substrate 2.

A portion $3_H$ of the drift layer 3 defined between the RESURF layer 9 and the trench 4 is continuous to a portion $3_v$ (hereinafter referred to as "isolation region") of the drift layer 3 defined between the RESURF layer 9 and the silicon substrate 2 (drain region). The drift layer 3 has a generally uniform impurity concentration, so that the portion $3_H$ between the RESURF layer 9 and the trench 4 and the isolation region $3_v$ have substantially the same impurity concentration.

The position $D_1$ of an interface between the isolation region $3_v$ and the RESURF layer 9 (the position of an interface between a portion 9a of the RESURF layer 9 opposed to the silicon substrate 2 and the drift layer 3) and the position $D_2$ of an upper surface of the silicon oxide portion 15 (an interface between the silicon oxide portion 15 and the polysilicon portion 16) are at substantially the same depth as measured from a surface of the super junction structural portion 13. Therefore, the position $D_2$ of the upper surface of the silicon oxide portion 15 is shallower than an interface between the silicon substrate 2 and the drift layer 3 as measured from a surface of the drift layer 3.

A source region 7 of an N$^+$-type conductivity is provided in a surface portion of the super junction structural portion 13 (on the RESURF layer 9) adjacent to the trench 4. A base region 8 of a P$^-$-type conductivity is provided between the source region 7 and the drift layer 3, between the source region 7 and the RESURF layer 9 and between the source region 7 and the silicon oxide film 5.

A gate electrode 10 is disposed in the vicinity of the surface of the drift layer 3 in opposed relation to a portion of the base region 8 between the drift layer 3 and the source region 7, and portions of the drift layer 3 and the source region 7 adjacent to this portion. The gate electrode 10 is composed of polysilicon imparted with electrical conductivity by introduction of an impurity. The gate electrode 10 is covered with a silicon oxide film 11. Therefore, the gate electrode 10 is isolated from the base region 8 by the silicon oxide film 11.

A source electrode 12 of aluminum is provided on a surface of the silicon substrate 2 formed with the drift layers 3 and the RESURF layers 9. The source electrode 12 is electrically connected to the source region 7 and the base region 8. A drain electrode 14 is provided on a back surface of the silicon substrate 2 (opposite from the source electrode 12).

The semiconductor device 1 is used in such a state that, with one of the source electrode 12 and the drain electrode 14 connected to an external load, a predetermine voltage (e.g., several hundreds volts) from a power source is applied between the external load and the other of the source electrode 12 and the drain electrode 14. The applied voltage provides a reverse bias to PN junctions defined between the RESURF layers 9 and the drift layers 3.

In this state, the gate electrodes 10 are kept at a predetermined potential (the semiconductor device 1 is turned on), whereby electric currents flow between the source electrode 12 and the drain electrode 14. At this time, channels are formed in the portions of the base regions 8 between the drift layers 3 and the source regions 7 adjacent to the interfaces between the silicon oxide films 11 and the base regions 8.

At this time, a reverse bias (e.g., 2V) resulting from voltage division between the external load and the ON-resistances of MOS FETs is applied to the PN junctions defined between the RESURF layers 9 and the drift layers 3. However, depletion layers occurring due to the reverse bias spread to a negligible extent, so that carrier (electron) paths are present in the drift layers 3. In the semiconductor device 1 in the ON state, the electric currents flow between the source electrode 12 and the drain electrode 14 through non-depleted portions of the drift layers 3.

On the other hand, when the semiconductor device 1 is off, i.e., when the gate electrodes 10 are not kept at the predetermined potential, the channels are not formed, so that no electric current flows in the MOS FETs. Therefore, the whole source voltage is applied as a reverse bias to the PN junctions defined between the drift layers 3 and the RESURF layers 9. Hence, the depletion layers spread into the drift layers 3 and the RESURF layers 9 from interfaces S between the drift layers 3 and the RESURF layers 9 in the vicinity of the interfaces S. In the drift layers 3, the depletion layers immediately spread from the interfaces S toward the trenches 4 and the silicon substrate 2 which are opposed to the interfaces S with the intervention of the drift layers 3.

Since the depletion layers uniformly spread from the interfaces S into the drift layers 3 having a generally uniform impurity concentration, locally strong electric fields do not occur. Therefore, the electric currents do not easily flow through the interfaces S, so that the semiconductor device 1 has a higher breakdown voltage.

Even if the drift layers 3 each have a higher impurity concentration, complete depletion of the drift layers 3 and the RESURF layers 9 can be easily achieved by reducing the widths of the drift layers 3 and the RESURF layers 9. Therefore, the semiconductor device 1 has a higher breakdown voltage. Further, the ON-resistances can be reduced by increasing the impurity concentrations of the drift layers 3 defining parts of the electric conduction paths in the ON state.

The semiconductor device 1 typically has a breakdown voltage of about 200V to about 1000V. Where the semiconductor device has a breakdown voltage of 600V, for example, the semiconductor device has an ON-resistance which is about one fifth of that of the prior art semiconductor device.

FIGS. 2(a) to 2(h) are schematic sectional views for explaining a production method for the semiconductor device 1 of FIG. 1. In FIGS. 2(a) to 2(h), only a portion of the semiconductor device associated with one trench 4 is shown.

Figure 2A:
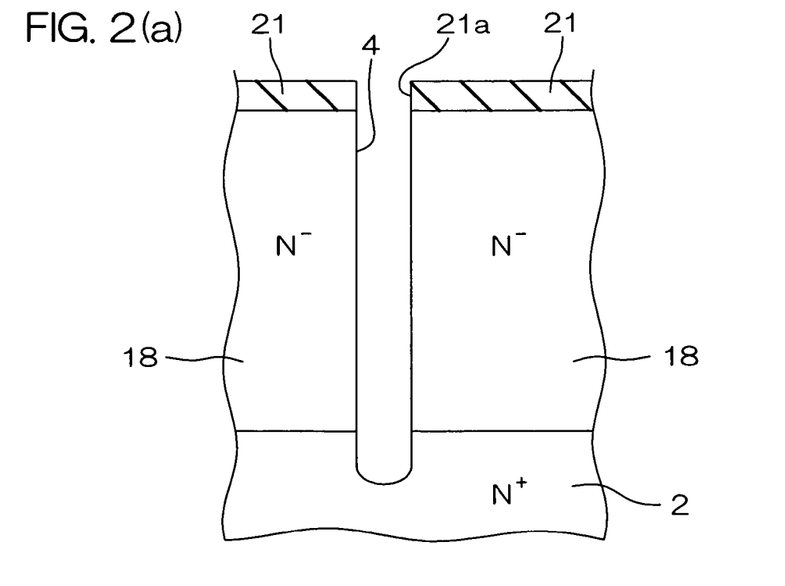
FIGS. 2(a) to 2(h) are schematic sectional views for explaining a production method for the semiconductor device of FIG. 1.

First, an epitaxial layer 18 of the N$^-$-type conductivity is formed on a silicon substrate 2 of the N$^+$-type conductivity, and a hard mask 21 having openings 21a formed in positions corresponding to the trenches 4 is formed on the epitaxial layer 18. The hard mask 21 is composed of, for example, silicon nitride.

Then, the epitaxial layer 18 is dry-etched through the openings 21a of the hard mask 21 (for example, by reactive ion etching), whereby trenches 4 each having a depth such as to reach the silicon substrate 2 are formed in the epitaxial layer 18 as extending thicknesswise of the epitaxial layer. The trenches 4 each have a width of, for example, about 2 μm, and a depth of, for example, about 40 μm. This state is shown in FIG. 2(a).

Figure 2B:
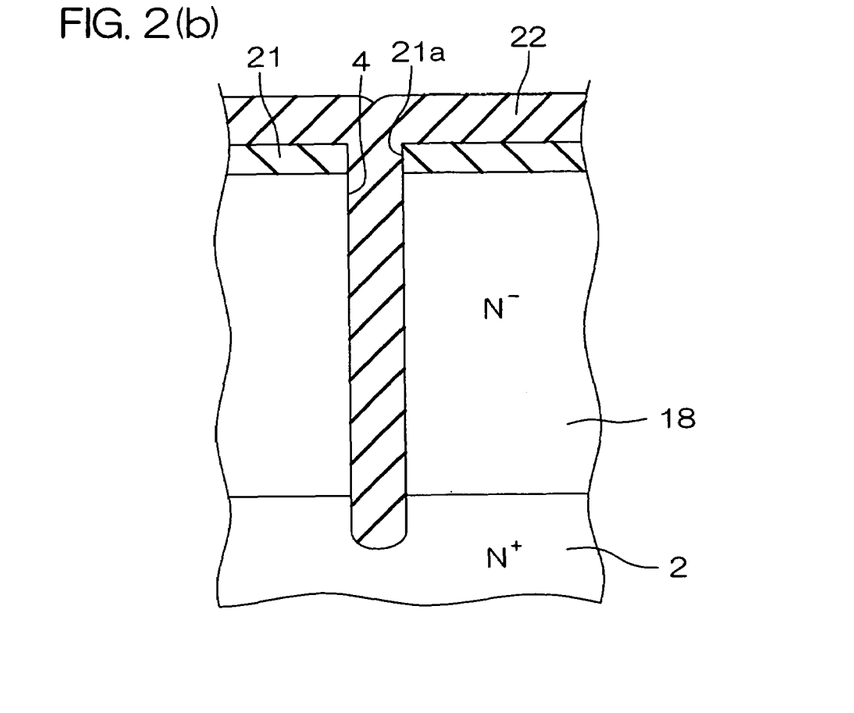

Subsequently, a silicon oxide film 22 is formed over the resulting silicon substrate 2 as filling the insides of the trenches 4 (see FIG. 2(b)). The silicon oxide film 22 is also formed on the hard mask 21. The formation of the silicon oxide film 22 may be achieved, for example, by forming a polysilicon film to fill the insides of the trenches 4 and then thermally oxidizing the entire polysilicon film, or by forming a TEOS (tetraethylorthosilicate) film by a reduced pressure CVD (chemical vapor deposition) method and then thermally decomposing the TEOS film.

Figure 2C:
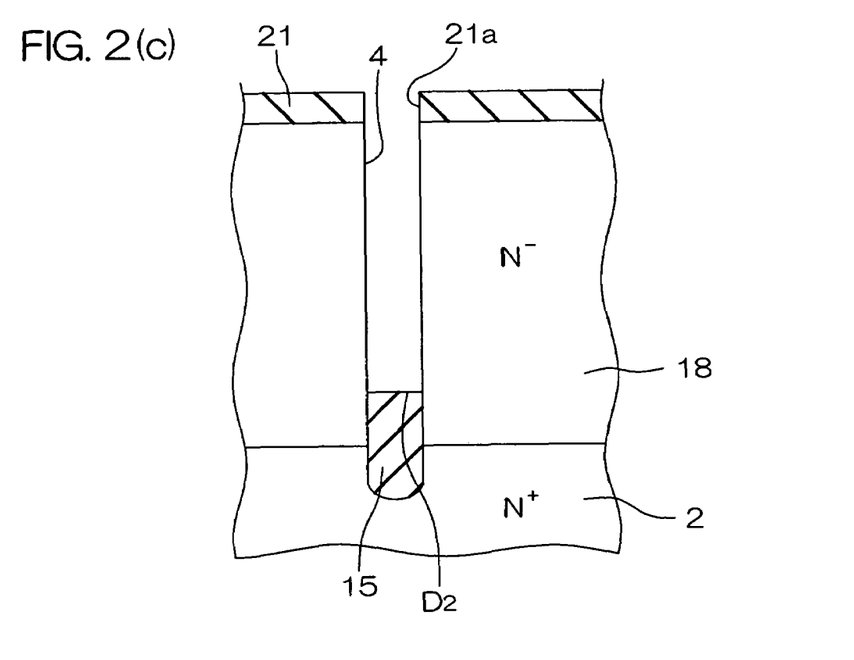

In turn, the silicon oxide film 22 except portions thereof present in the bottoms of the trenches 4 is etched back, whereby voids are provided in upper portions of the respective trenches 4. The remaining portions of the silicon oxide film 22 serve as the silicon oxide portions 15. At this time, proper etching-back conditions are selected so that upper surfaces of the silicon oxide portions 15 are located at a position $D_2$ (predetermined upper surface position) which is shallower than an interface between the silicon substrate 2 and the epitaxial layer 18 as measured from the surface of the epitaxial layer 18. This state is shown in FIG. 2(c).

Next, P-type impurity ions are implanted into portions of the epitaxial layer 18 exposed to interior surfaces of the trenches 4 through the openings 21a of the hard mask 21. At this time, the ions are implanted at a predetermined inclination angle with respect to interior side walls of the trenches 4 perpendicular to the widths of the trenches 4 as indicated by arrows A in FIG. 2(d). The angle of an ion implantation direction with respect to the interior side walls of the trenches 4 (with respect to a direction normal to the silicon substrate 2) is, for example, 1.5 degrees to 2 degrees.

Figure 2D:
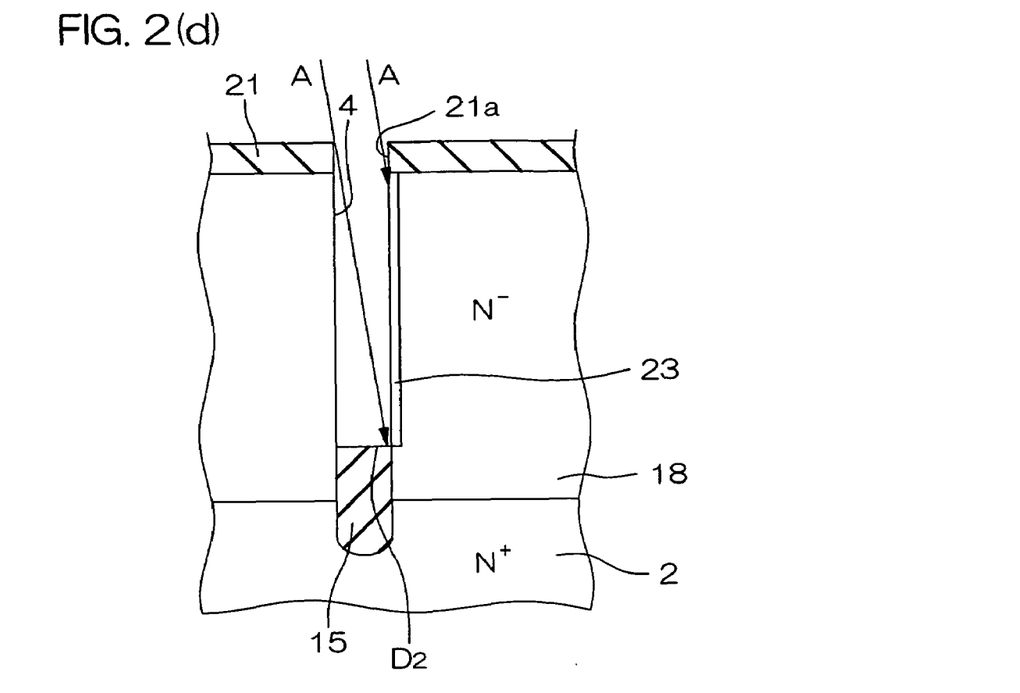

Thus, a first implanted region 23 implanted with the P-type impurity is formed in substantially the entire interior side wall of each of the trenches 4 on one of widthwise opposite sides of the trench 4 (corresponding to a side of the trench 4 of the semiconductor device 1 where the RESURF layer 9 is provided in proximity to the trench). This state is shown in FIG. 2(d).

Figure 2E:
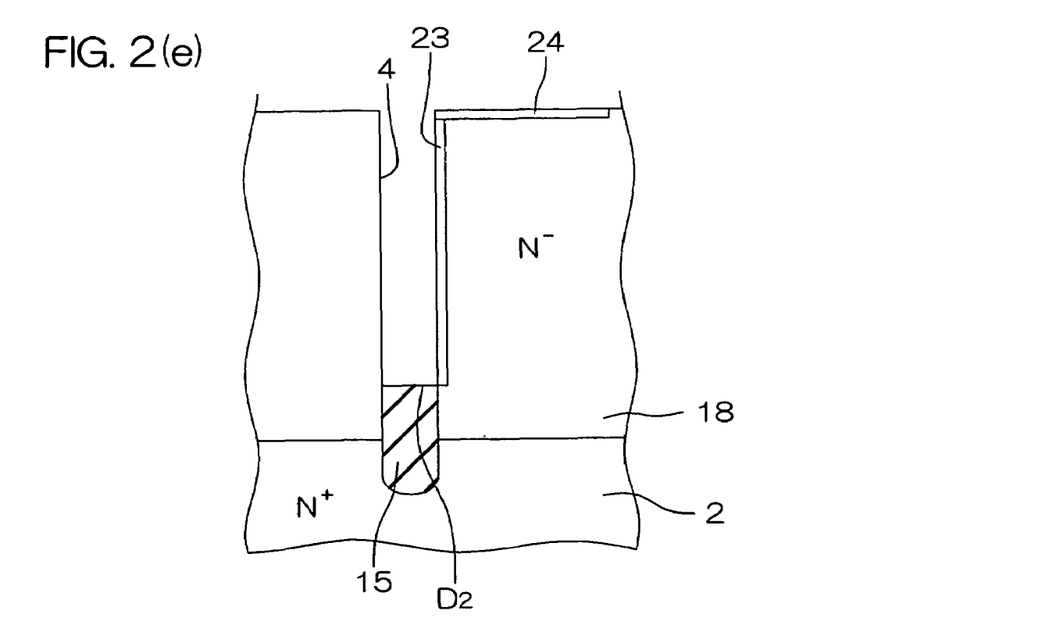

Next, the hard mask 21 is removed, and a resist film (not shown) having openings formed in positions corresponding to the base regions 8 is formed on the epitaxial layer 18. Then, a P-type impurity is implanted into surface portions of the epitaxial layer 18 through the openings of the resist film, whereby second implanted regions 24 are formed. Thereafter, the resist film is removed. This state is shown in FIG. 2(e).

Figure 2F:
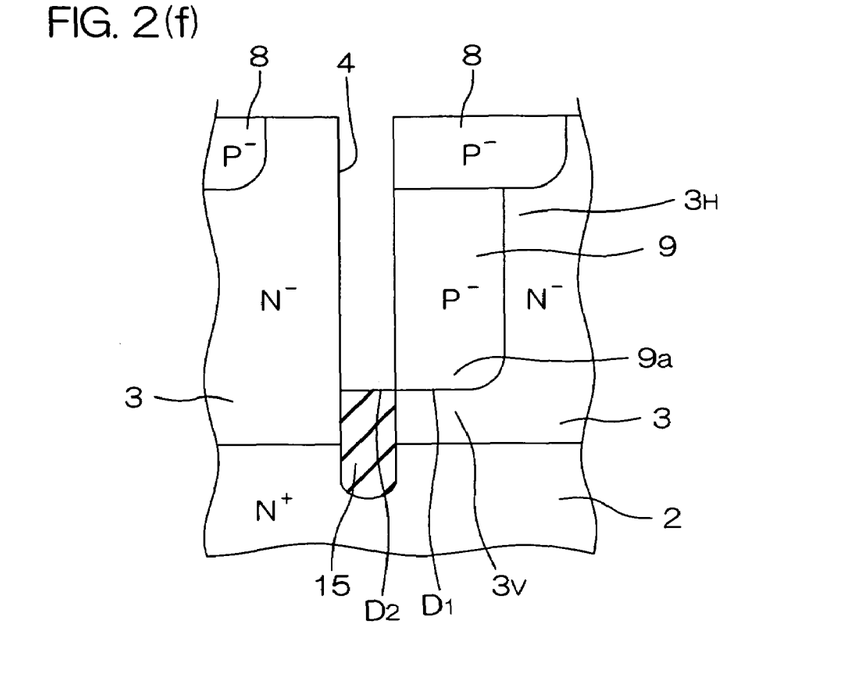

Subsequently, the resulting silicon substrate 2 is heated to a predetermined temperature, whereby the P-type impurities are diffused into the epitaxial layer 18 from the first and second implanted regions 23, 24. Thus, the RESURF layers 9 and the base regions 8 are formed. The remaining portions of the epitaxial layer 18 serve as the drift layers 3. This state is shown in FIG. 2(f).

Figure 2G:
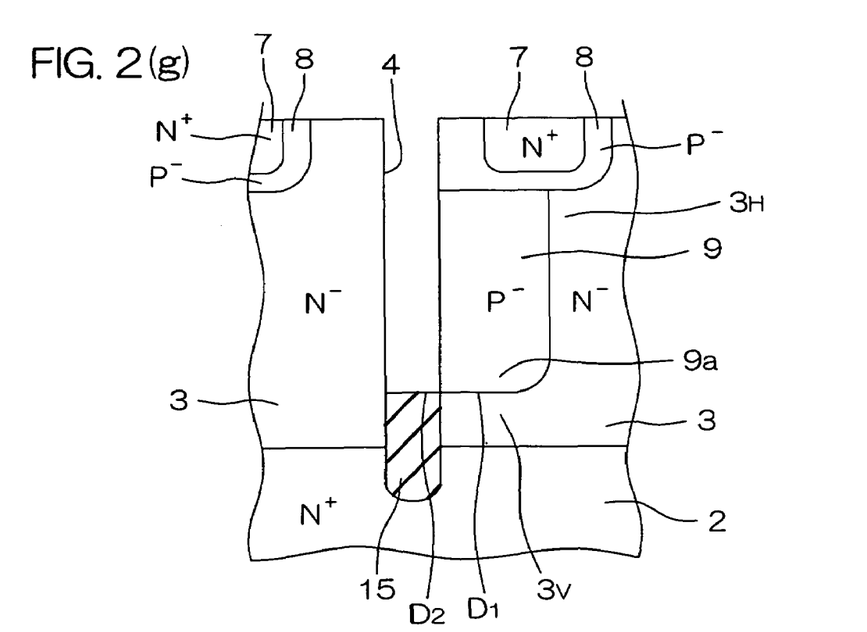

Next, a resist film (not shown) having openings formed in positions corresponding to the source regions 7 is formed on a surface of the resulting silicon substrate 2 formed with the epitaxial layer 18. Then, an N-type impurity is implanted into surface portions of the base regions 8 through the openings of the resist film, whereby third implanted regions are formed. Thereafter, the resist film is removed, and the resulting silicon substrate 2 is heated to a predetermined temperature, whereby the N-type impurity is diffused into the base regions 8 from the third implanted regions. Thus, the source regions 7 are formed. This state is shown in FIG. 2(g).

Figure 2H:
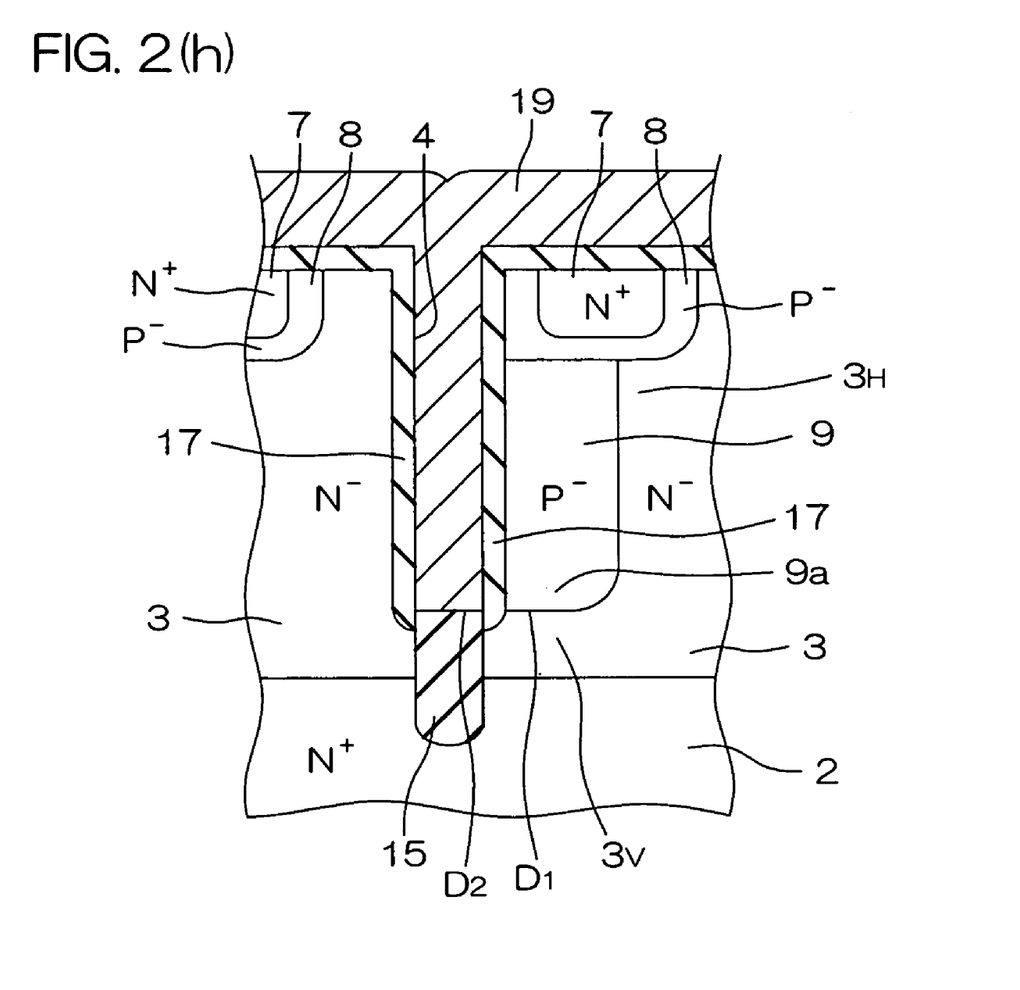

In turn, the resulting silicon substrate 2 is heated to a predetermined temperature, whereby an exposed surface portion of the silicon substrate including interior surfaces of the trenches 4 and surfaces of the drift layers 3, the base regions 8 and the source regions 7 is thermally oxidized to form an oxide film 17. Further, a film 19 of polysilicon (polysilicon film) is formed on the oxide film 17. The trenches 4 are almost completely filled with the polysilicon film 19. Thereafter, the polysilicon film 19 is imparted with an electrical conductivity by implantation of an impurity. This state is shown in FIG. 2(h).

Subsequently, a portion of the polysilicon film 19 other than those corresponding to the insides of the trenches 4 and the gate electrodes 10 is removed. The portions of the polysilicon film 19 remaining in the trenches 4 serve as the polysilicon portions 16. Further, exposed surface portions of the polysilicon film 19 are thermally oxidized to form oxide films.

Then, the oxide films on the trenches 4 and the oxide films other than those on peripheral surfaces of the gate electrodes 10 outside the trenches 4 are removed. Thus, the portions of the polysilicon film remaining outside the trenches 4 serve as the gate electrodes 10. The portions of the oxide film 17 remaining in the trenches 4 serve as the silicon oxide films 5, and the oxide films remaining outside the trenches 4 serve as the silicon oxide films 11 covering the peripheral surfaces of the gate electrodes 10.

Thereafter, the source electrode 12 and the drain electrode 14 are respectively formed on a surface of the resulting silicon substrate 2 formed with the source regions 7 and on a surface of the substrate opposite from the source regions. Thus, the semiconductor device 1 shown in FIG. 1 is provided.

In the aforesaid production method, the silicon oxide portions 15 are present in the bottoms of the respective trenches 4 up to the position $D_2$ shallower than the interface between the silicon substrate 2 and the epitaxial layer 18 when the first implanted regions 23 are formed (see FIG. 2(d)). Therefore, the silicon oxide portions 15 prevent the P-type impurity from being introduced into portions of the epitaxial layer 18 adjacent to the silicon substrate 2. Thus, the RESURF layers 9 are isolated from the silicon substrate 2 by the drift layers 3 (isolation regions $3_v$).

The upper surface position $D_2$ of the silicon oxide portions 15 can be controlled by controlling the thickness of portions of the silicon oxide film 22 to be etched back (see FIG. 2(c)). Thus, the RESURF layers 9 can be formed in controlled ranges, so that the thickness of the portions (isolation regions $3_v$) of the drift layers 3 between the silicon substrate 2 and the RESURF layers 9 is controlled to allow the depletion layers to evenly spread from the interfaces S in the semiconductor device 1.

Figure 3:
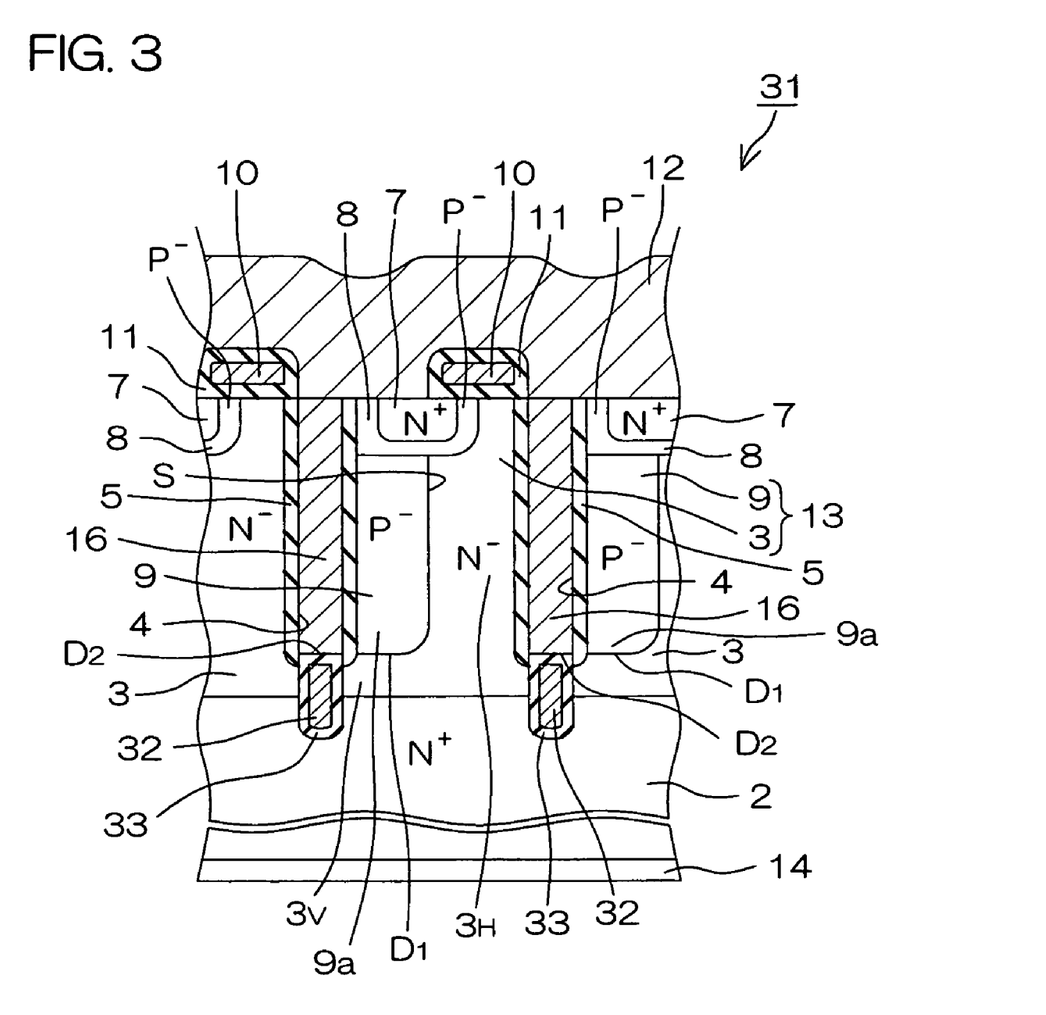
FIG. 3 is a schematic sectional view illustrating the construction of a semiconductor device according to a second embodiment of the present invention.

FIG. 3 is a schematic sectional view of a semiconductor device according to a second embodiment of the present invention. In FIG. 3, parts corresponding to those shown in FIG. 1 will be denoted by the same reference characters as in FIG. 1, and no explanation will be given to these parts.

In the semiconductor device 31, a polysilicon portion 32 and an oxide film 33 surrounding the polysilicon portion 32 are provided in the bottom of each of the trenches 4 instead of the silicon oxide portion 15 of the semiconductor device 1 of FIG. 1. The inside of the trench 4 is almost completely filled with the polysilicon portions 32, 16 and the oxide film 33. Thus, the silicon substrate 2 is less liable to be warped.

In this semiconductor device 31, the RESURF layers 9 do not contact the silicon substrate 2 (drain region). When the semiconductor device 31 is off, the depletion layers uniformly spread in the drift layers 3 from the interfaces S toward the trenches 4 and the silicon substrate 2 which are opposed to the interfaces S with the intervention of the drift layers 3. Therefore, locally strong electric fields do not occur. Since the electric currents do not easily flow through the interfaces S, the semiconductor device 31 has a higher breakdown voltage.

FIGS. 4(a) to 4(d) are schematic sectional views for explaining a production method for the semiconductor device 31. In FIGS. 4(a) to 4(d), parts corresponding to those shown in FIGS. 2(a) to 2(h) will be denoted by the same reference characters as in FIGS. 2(a) to 2(h), and no explanation will be given to these parts.

Figure 4A:
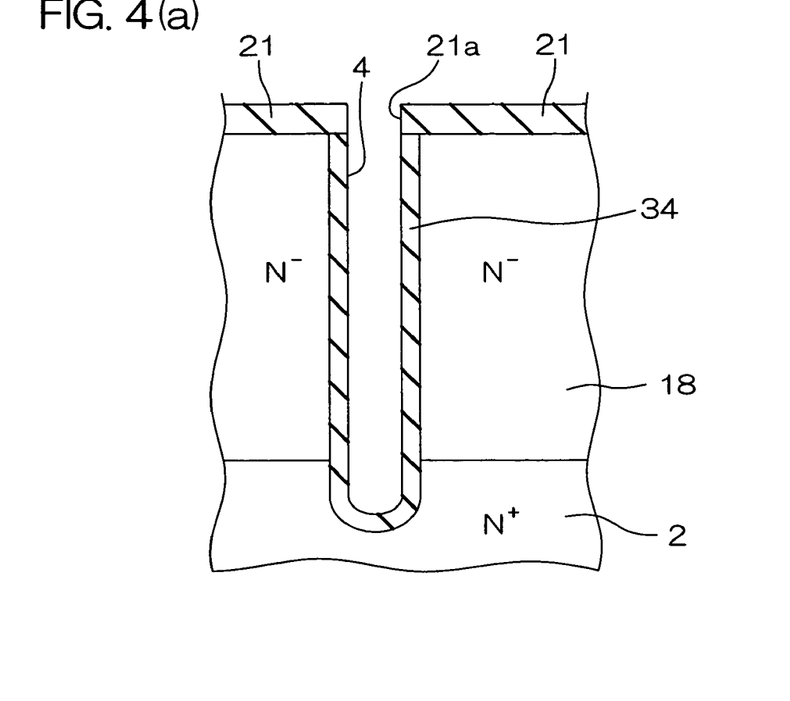
FIGS. 4(a) to 4(d) are schematic sectional views for explaining a production method for the semiconductor device of FIG. 3.
Figure 4B:
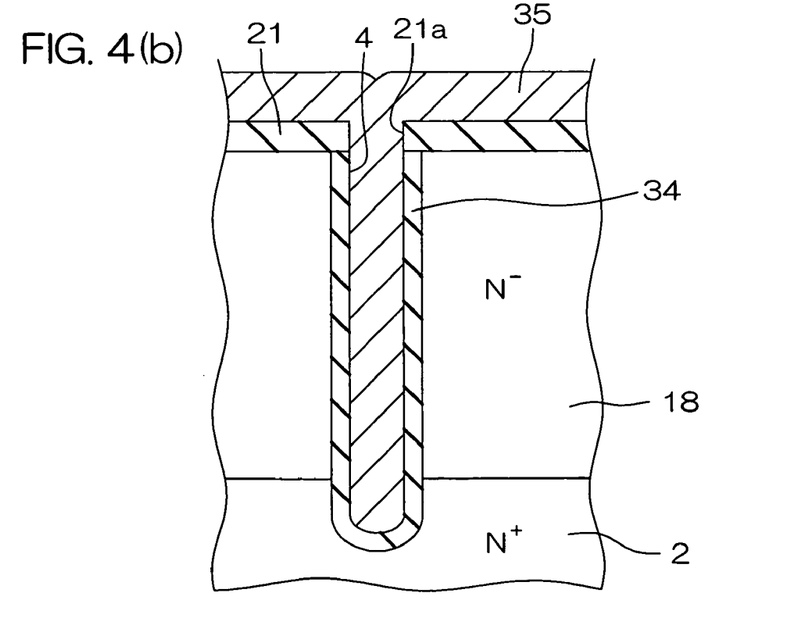

After the steps up to the step for the formation of the trenches 4 are performed in the same manner as in the production of the semiconductor device 1, the silicon substrate 2 is heated, whereby exposed surfaces of the silicon substrate 2 and the epitaxial layer 18, i.e., the interior surfaces of the trenches 4, are thermally oxidized to form sacrificial oxide films 34 (see FIG. 4(a)).

Next, a polysilicon film 35 is formed to almost completely fill the insides of the trenches 4. The polysilicon film 35 is also formed outside the trenches 4, i.e., on the hard mask 21 (see FIG. 4(b)).

Figure 4C:
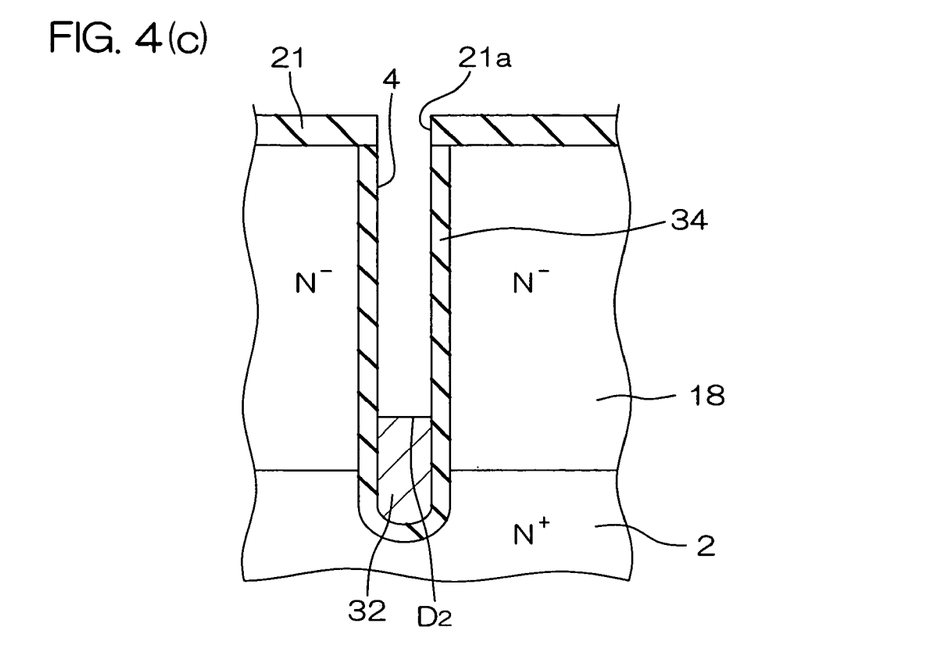

Subsequently, the polysilicon film 35 except portions thereof present in the bottoms of the trenches 4 is etched back, whereby voids are formed in the upper portions of the trenches 4. The remaining portions of the polysilicon film 35 serve as the polysilicon portions 32. The etching-back conditions are determined so that upper surfaces (etched-back surfaces) of the polysilicon portions 32 are each located at a position (predetermined upper surface position) $D_2$ which is shallower than the interface between the silicon substrate 2 and the epitaxial layer 18 as measured from the surface of the epitaxial layer 18. This state is shown in FIG. 4(c).

Then, exposed portions of the sacrificial oxide films 34 are etched away. Portions of the sacrificial oxide films 34 present between the polysilicon portions 32 and the silicon substrate 2 and between the polysilicon portions 32 and the epitaxial layer 18 remain.

Figure 4D:
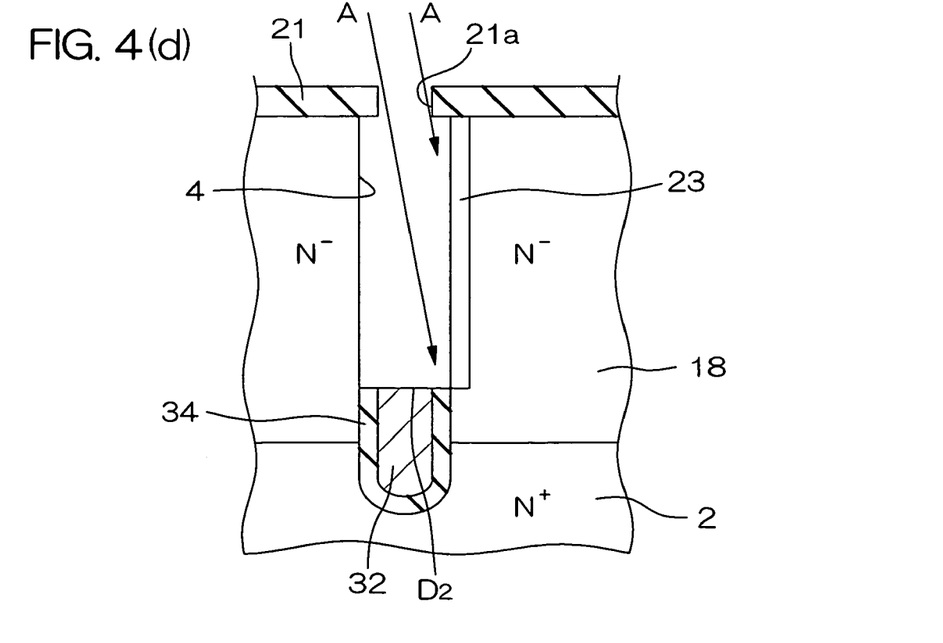

Thereafter, the step for the formation of the first implanted regions 23 (see FIG. 4(d)) and the steps subsequent to this step are performed in the same manner as in the production method for the semiconductor device 1. Thus, the semiconductor device 31 shown in FIG. 3 is provided. At this time, the upper surfaces (etched-back surfaces) of the polysilicon portions 32 are also oxidized when the oxide film 17 is formed (see FIG. 2(h)). The resulting oxide films and the remaining portions of the sacrificial oxide films 34 provide the oxide films 33 which respectively surround the polysilicon portions 32.

Figure 5:
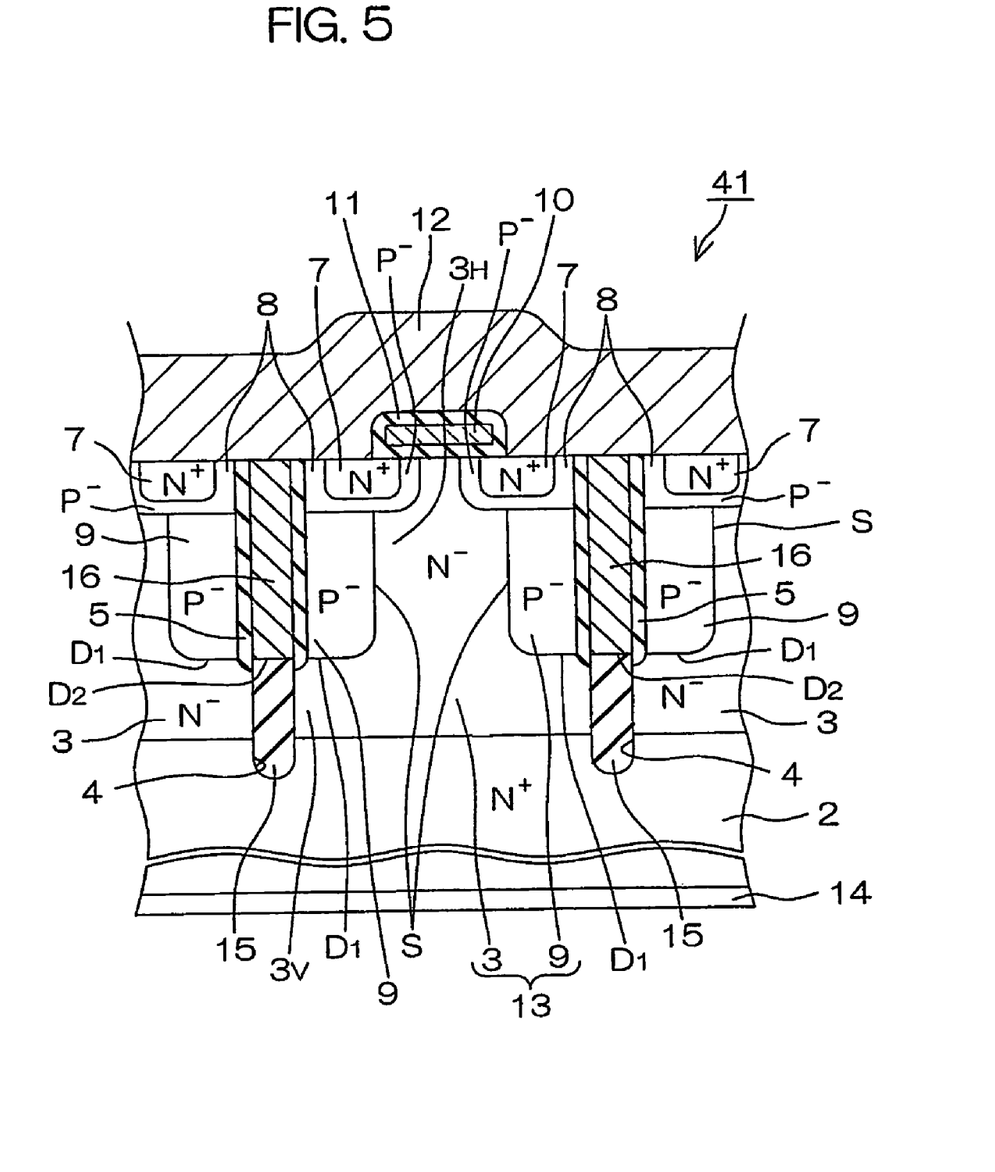
FIG. 5 is a schematic sectional view illustrating the construction of a semiconductor device according to a third embodiment of the present invention.

FIG. 5 is a schematic sectional view illustrating the construction of a semiconductor device according to a third embodiment of the present invention. In FIG. 5, parts corresponding to those shown in FIG. 1 will be denoted by the same reference characters as in FIG. 1, and no explanation will be given to these parts.

This semiconductor device 41 has substantially the same construction as the semiconductor device 1 shown in FIG. 1, except that the RESURF layers 9 are provided on widthwise opposite sides of each of the trenches 4. The drift layers 3 are each partly present between the RESURF layers 9 and the silicon substrate 2 serving as the drain region, so that the RESURF layers 9 do not contact the silicon substrate 2.

Therefore, the depletion layers uniformly spread from the interfaces S toward the adjacent RESURF layers 9 and toward the silicon substrate 2 in the drift layers 3 each having a generally even impurity concentration, so that locally strong electric fields do not occur. Thus, the electric currents do not easily flow through the interfaces S. Therefore, the semiconductor device 41 has a higher breakdown voltage.

The semiconductor device 41 is produced by forming the silicon oxide portions 15 so that the upper surfaces of the silicon oxide portions 15 are each located at the position (predetermined upper surface position) $D_2$ which is shallower than the interface between the silicon substrate 2 and the epitaxial layer 18 as measured from the surface of the epitaxial layer 18, and then implanting the P-type impurity into widthwise opposite interior side walls of the trenches 4 in the production method for the semiconductor device 1.

In the step for the implantation of the P-type impurity ions, the ions are implanted in two directions which are inclined at a very small inclination angle with respect to the interior side walls of the trenches 4 and extend widthwise of the trenches 4 (perpendicularly to the lengths of the trenches) as seen perpendicularly to the silicon substrate 2.

In this case, the P-type impurity is not introduced into portions of the epitaxial layer 18 adjacent to the silicon substrate 2, so that the RESURF layers 9 are isolated from the silicon substrate 2 by the portions (drift layers 3) of the epitaxial layer 18 remaining intact.

While the embodiments of the present invention have thus been described, the invention may be embodied in any other ways. In the production method for the semiconductor device 31 according to the second embodiment, the sacrificial oxide films 34 may be entirely removed after the formation of the sacrificial film 34 (see FIG. 4(a)), and then oxide films equivalent to the sacrificial films 34 may be formed, followed by the steps subsequent to the step for the formation of the polysilicon film 35.

While the present invention has been described in detail by way of the embodiments thereof, it should be understood that these embodiments are merely illustrative of the technical principles of the present invention but not limitative of the invention. The spirit and scope of the present invention are to be limited only by the appended claims.

This application corresponds to Japanese Patent Application No. 2003-435266 filed with the Japanese Patent Office on Dec. 26, 2003, the disclosure of which is incorporated herein by reference.

What is claimed is:

1. A production method for a semiconductor device which includes a super junction structural portion provided on a semiconductor substrate of a first conductivity and including drift layers of the first conductivity and RESURF layers of a second conductivity different from the first conductivity, the drift layers and the RESURF layers being laterally arranged in alternate relation in a direction parallel to the semiconductor substrate, the production method comprising the steps of:

forming a semiconductor layer of the first conductivity on the semiconductor substrate;

forming a trench in the semiconductor layer, the trench penetrating through the semiconductor layer to reach the semiconductor substrate;

filling a filling material in a predetermined bottom portion of the trench, so that a filling material portion is provided in the bottom portion of the trench up to a predetermined upper surface position which is shallower than an interface between the semiconductor substrate and the semiconductor layer, a void is provided in an upper portion of the trench above the predetermined upper surface position, and a part of the filling material is located in the semiconductor substrate, wherein the filling step further includes the steps of:

supplying the filling material into the trench up to a position which is shallower than the predetermined upper surface position;

after the filling material supplying step, etching back the supplied filling material to the predetermined upper surface position; and after the filling step, introducing an impurity of the second conductivity into a portion of the semiconductor layer exposed to an interior side wall of the trench, whereby the RESURF layers of the second conductivity are each formed alongside the interior side wall of the trench and the drift layers are each defined by a portion of the semiconductor layer remaining intact.

2. A semiconductor device production method as set forth in claim 1, wherein the filling step includes the step of filling silicon oxide as the filling material in the trench.

3. A semiconductor device production method as set forth in claim 1, further comprising the step of oxidizing an interior wall of the trench to form an oxide film before the filling step, wherein the filling step includes the step of filling polysilicon as the filling material in the trench.

4. A semiconductor device production method as set forth in claim 1, further comprising the step of filling the void provided in the upper portion of the trench with an upper filling material after the RESURF layers formation step.

5. A semiconductor device production method as set forth in claim 1, further comprising the steps of:

introducing an impurity of the second conductivity into a surface portion of the semiconductor layer to form a base region of the second conductivity in contact with one of the RESURF layers and one of the drift layers;

introducing an impurity of the first conductivity into a portion of the base region to form a source region of the first conductivity which is isolated from one of the drift layers and one of the RESURF layers by the other portion of the base region;

forming a gate insulation film opposed to a portion of the base region between the source region and one of the drift layers; and forming a gate electrode opposed to the portion of the base region between the source region and one of the drift layers with the intervention of the gate insulation film.

6. A semiconductor device production method as set forth in claim 1, wherein the RESURF layers formation step includes the steps of:

implanting an impurity of the second conductivity into a surface portion of the semiconductor layer exposed to the interior side wall of the trench; and performing a thermal diffusion process to heat the resulting semiconductor substrate after the implantation step for diffusing the implanted impurity into the semiconductor layer.

* * * * *

UNITED STATES PATENT AND TRADEMARK OFFICE
CERTIFICATE OF CORRECTION

| | |
|---|---|
| PATENT NO. | : 7,642,139 B2 |
| APPLICATION NO. | : 10/577360 |
| DATED | : January 5, 2010 |
| INVENTOR(S) | : Masaru Takaishi |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 661 days.

Signed and Sealed this

Sixteenth Day of November, 2010

David J. Kappos
*Director of the United States Patent and Trademark Office*